(12) United States Patent
Liu et al.

(10) Patent No.: US 9,790,082 B1
(45) Date of Patent: Oct. 17, 2017

(54) CMOS AND PRESSURE SENSOR INTEGRATED ON A CHIP AND FABRICATION METHOD

(71) Applicant: FREESCALE SEMICONDUCTOR, INC., Austin, TX (US)

(72) Inventors: Lianjun Liu, Chandler, AZ (US); Amitava Bose, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/271,627

(22) Filed: Sep. 21, 2016

(51) Int. Cl.
*B81B 3/00* (2006.01)
*B81C 1/00* (2006.01)
*G01L 9/00* (2006.01)

(52) U.S. Cl.
CPC ........ *B81B 3/0027* (2013.01); *B81C 1/00246* (2013.01); *G01L 9/0052* (2013.01); *B81B 2201/0264* (2013.01); *B81B 2207/015* (2013.01); *B81B 2207/07* (2013.01); *B81C 2201/0132* (2013.01); *B81C 2201/053* (2013.01)

(58) Field of Classification Search
CPC .............. B81B 3/0027; B81B 2207/07; B81B 2207/015; B81B 2201/0264; B81C 1/00246; B81C 2201/0132; B81C 2201/053; G01L 9/0052
See application file for complete search history.

(56) References Cited

U.S. PATENT DOCUMENTS

| 5,514,898 A | 5/1996 | Hartauer |
| 6,263,740 B1 | 7/2001 | Sridhar et al. |
| 2016/0153857 A1* | 6/2016 | Matsuzawa ........... G01L 9/0054 73/727 |

* cited by examiner

*Primary Examiner* — David Vu
(74) *Attorney, Agent, or Firm* — Charlene R. Jacobsen

(57) ABSTRACT

A device comprises a silicon-on-insulator (SOI) substrate having first and second silicon layers with an insulator layer interposed between them. A structural layer, having a first conductivity type, is formed on the first silicon layer. A well region, having a second conductivity type opposite from the first conductivity type, is formed in the structural layer, and resistors are diffused in the well region. A metallization structure is formed over the well region and the resistors. A first cavity extends through the metallization structure overlying the well region and a second cavity extends through the second silicon layer, with the second cavity stopping at one of the first silicon layer and the insulator layer. The well region interposed between the first and second cavities defines a diaphragm of a pressure sensor. An integrated circuit and the pressure sensor can be fabricated concurrently on the SOI substrate using a CMOS fabrication process.

20 Claims, 11 Drawing Sheets

CMOS AND PRESSURE SENSOR INTEGRATED ON A CHIP AND FABRICATION METHOD

TECHNICAL FIELD OF THE INVENTION

The present invention relates generally to semiconductor devices and methods for making semiconductor devices. More specifically, the present invention relates to a complementary metal oxide semiconductor (CMOS) circuit and a pressure sensor integrated on a single substrate, both of which are concurrently fabricated using a CMOS fabrication process.

BACKGROUND OF THE INVENTION

A piezoresistive pressure transducer includes a number of piezoresistors placed near the edge of a diaphragm where the stress change is high under external pressure. Accordingly, external pressure on the diaphragm stresses the diaphragm, which affects the resistance of the piezoresistors. The change in resistance can be detected by external circuitry, and the change in resistance is used to determine the pressure applied to the diaphragm.

The miniaturization of sensors and electronic circuits is an ongoing effort for a multitude of applications in, for example, the consumer, industrial, medical, and automotive markets. Some miniaturized designs attempt to combine an application specific integrated circuit (ASIC) and a microelectromechanical systems (MEMS) sensor onto a single chip using, for example, a complementary metal oxide semiconductor (CMOS) fabrication process. A CMOS fabrication process can provide many logic gates and other digital circuits per unit area, is relatively inexpensive, and typically yields reliable circuits.

Unfortunately, process differences between a CMOS fabrication process and a piezoresistive pressure transducer fabrication process have complicated the development of a cost effective method for integrating a CMOS integrated circuit and a piezoresistive pressure transducer on a single chip. Thus, many piezoresistive pressure devices consist of a separate CMOS signal processing die and a pressure sensor die co-packaged through wirebonding to form the pressure sensor system. Such a configuration has the disadvantages of more complicated packaging, relatively large footprint, and relatively high cost. Some prior art methods of integrating a CMOS signal processor and a pressure sensor on a single chip use an electrochemical etch (ECE) method to form a pressure sensor cavity. Such integration methods using ECE methodology have the disadvantages of relatively complicated processing and high cost.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a pressure sensor, a device that includes a pressure sensor integrated with a complementary metal oxide semiconductor (CMOS) integrated circuit on a single substrate, and methodology for concurrently fabricating the pressure sensor and the CMOS integrated circuit using a CMOS fabrication process. The various inventive concepts and principles embodied herein enable the fabrication of an integrated pressure sensor and the CMOS integrated circuit to improve fabrication efficiency, simplify system packaging, minimize device footprint, improve device performance, and achieve cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
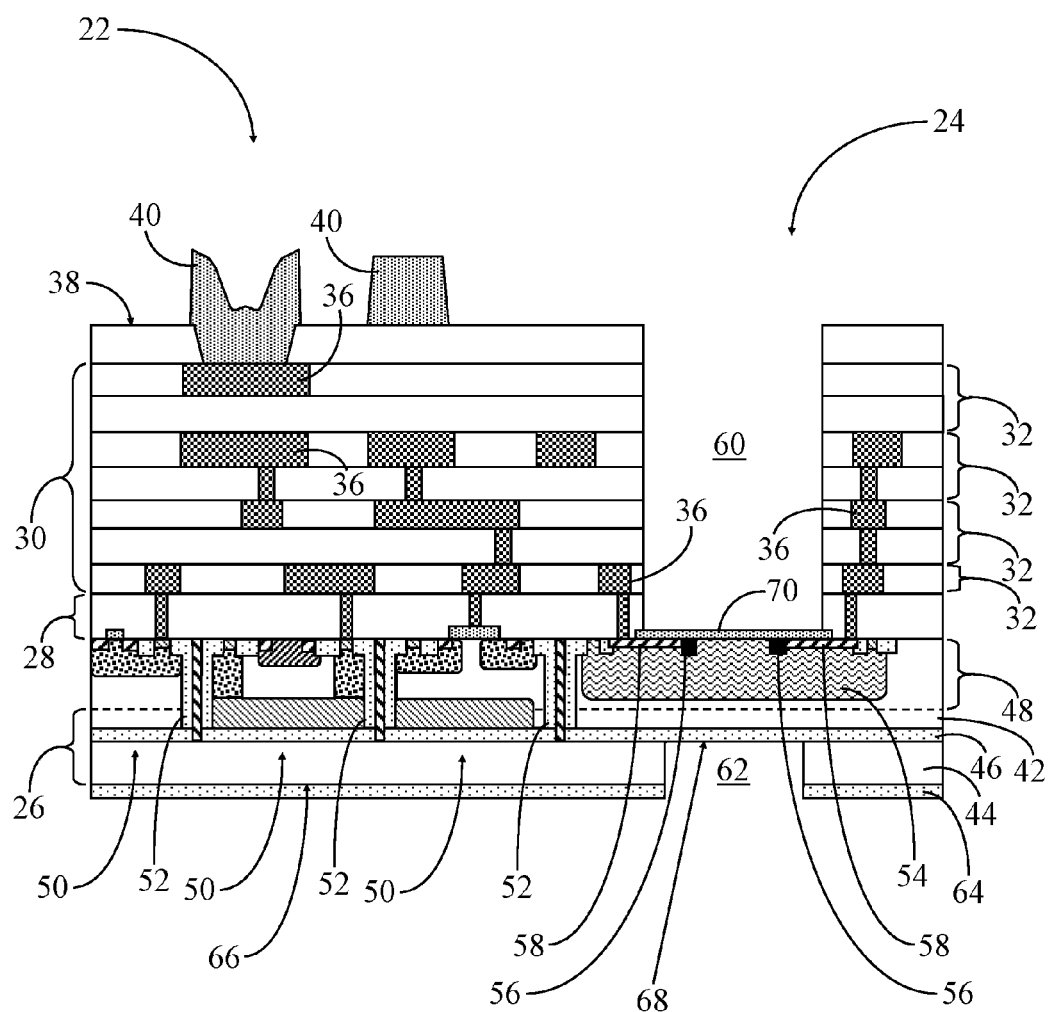
FIG. 1 shows a simplified side view of device that includes a complementary metal oxide semiconductor (CMOS) integrated circuit (IC) and a pressure sensor integrated on a single substrate.

Referring to FIG. 1, FIG. 1 shows a simplified side view of a device 20 that includes a complementary metal oxide semiconductor (CMOS) integrated circuit (IC) 22 and a pressure sensor 24 integrated on a single substrate 26. Thus, device 20 will be referred to herein as a pressure sensor system 20. A dielectric structure 28 and a metallization structure 30 are formed over IC 22 and pressure sensor 24. Metallization structure 30 (sometimes referred to as inter metal dielectric layers) is in the form of multiple metallization layers 32. Dielectric structure 28 and metallization layers 32 of metallization structure 30 include electrically conductive material, referred to herein as electrical contacts 36, extending through them for carrying power and control signals to, as well as data output from, IC 22 and pressure sensor 24 in accordance with a particular design configuration. Thus, an exterior surface 38 of pressure sensor system 20 may include exterior structures 40, such as electrically conductive interconnects, ground traces, or bond pads (two example structures shown) that can be connected to various electrical contacts 36 in metallization structure 30. Accordingly, dielectric structure 28 and metallization structure 30 provides the signal and power routing between IC 22 and pressure sensor 24, as well as exterior to pressure sensor system 20.

In accordance with a particular embodiment, substrate 26 is a silicon-on-insulator (SOI) substrate. SOI substrate 26 includes a first silicon layer 42, a second silicon layer 44, and an insulator layer 46 interposed between first and second silicon layers 42, 44. A structural layer 48 is formed on first silicon layer 42 of SOI substrate 26. As will be described in significantly greater detail below, structural layer 48 may be an epitaxial layer having a first conductivity type (e.g., P type) fabricated in accordance with CMOS fabrication methodology.

IC 22 is formed on first silicon layer 42 of SOI substrate 26 in structural layer 48 again in accordance with CMOS fabrication methodology. IC 22 of pressure sensor system 20 is shown in highly simplified form with portions of a few transistors 50 separated by isolation structures 52. It should be readily apparent, however, that IC 22 may include a plurality of transistors 50 for implementing logic gates and other digital circuits in order to provide signal processing capability for pressure sensor 24. The detailed structure of IC 22 will not be described herein for brevity.

Pressure sensor 24 is also formed on first silicon layer 42 of SOI substrate 26 in structural layer 48 again in accordance with CMOS fabrication methodology. Pressure sensor 24 may be electrically isolated from transistors 50 of IC 22 by isolation structures 52. Pressure sensor 24 generally includes a well region 54, having a first conductivity type (e.g., N type), formed in structural layer 48. Pressure sensor 24 further includes at least one piezoresistor 56 (two shown) and electrical contact regions 58 in well region 54. Electrical contact regions 58 (e.g., P+ type) electrically interconnect piezoresistors 56 to their respective electrical contacts 36 extending through metallization structure 30.

A first cavity 60 extends through metallization structure 30 overlying well region 54. Electrical contacts 36 for pressure sensor 24 are laterally displaced away from first cavity 60. Additionally, a second cavity 62 extends through second silicon layer 44 of SOI substrate 26 and stops, in this example, at insulator layer 46 of SOI substrate 26. In other configurations, second cavity 62 extends through both of second silicon layer 44 and insulator layer 46 and stops at first silicon layer 42. A dielectric material layer 64 may be formed over an exterior surface 66 of silicon layer 44. Thus, second cavity 62 also extends through dielectric material layer 64. Accordingly, the remaining portion of first silicon layer 42 and the portion of structural layer 48 having well region 54 and insulator layer 54 interposed between first and second cavities 60, 62 defines a diaphragm 68 of pressure sensor 24.

A piezoresistive pressure transducer, such as pressure sensor 24, may be formed in a Wheatstone bridge configuration that includes four piezoresistors 56. These four piezoresistors 56 are placed near the edge of diaphragm 68 where the stress change is high under external pressure. Accordingly, external pressure on the diaphragm 68 stresses diaphragm 68, which affects the resistance of the piezoresistors 56. In pressure sensor system 20, the change in resistance can be detected by IC 22, and IC 22 can utilize the change of resistance to determine the pressure applied to diaphragm 68. Although a configuration that includes four piezoresistors 56 is discussed herein, it should be understood that alternative embodiments may include fewer than or greater than four piezoresistors 56 configured in numerous ways.

In some embodiments, a shield layer 70 may be formed over well region 54 of diaphragm 68. Dielectric material is commonly used in semiconductor devices, such as in pressure sensor system 20, for isolation and charge shielding. Undesirable charge accumulation can occur on the surface of such a device coated with a dielectric material as well as on intermediate layers that are capacitively coupled to the surface. Such charge accumulation can occur during manufacturing of pressure sensor system 20 (e.g., through reactive ion etching and other steps employing electric fields). The accumulated charge can be responsible for deleterious effects including electric field offsets, thin oxide tunneling, oxide breakdown, the formation of conductive channels between transistor terminal junctions, and so forth. In this configuration, the accumulated charge may cause an undesirable charging effect on piezoresistors 56. Shield layer 70 can serve to shield piezoresistors 56 from an external charge effect during manufacturing and/or in use.

In accordance with an embodiment, IC 22 and pressure sensor 24 are formed on a single substrate SOI substrate 26 by implementing CMOS fabrication methodology. SOI substrate 26 is used as a starting material, and IC 22 and pressure sensor 24 are fabricated directly on first silicon layer 42 of SOI substrate 26. In particular, the structures of pressure sensor 24 are formed during the CMOS fabrication process. The CMOS backend metallization structure 30 that includes metallization layers 32 and dielectric layers 34 are removed from diaphragm 68 of pressure sensor 24 through the formation of first cavity 60. Removal of metallization structure 30 from diaphragm 68 reduces the thermal and stress impact resulting from metallization structure 30. As will be discussed below, second silicon layer 44 of SOI substrate 26 can be removed using, for example, a deep reactive ion etch (DRIE) process from the backside of pressure sensor system 20 with insulator layer 46 being used as the DRIE process etch stop. Thus, diaphragm 68 is produced from the material remaining following formation of first and second cavities 60, 62.

Figure 2:
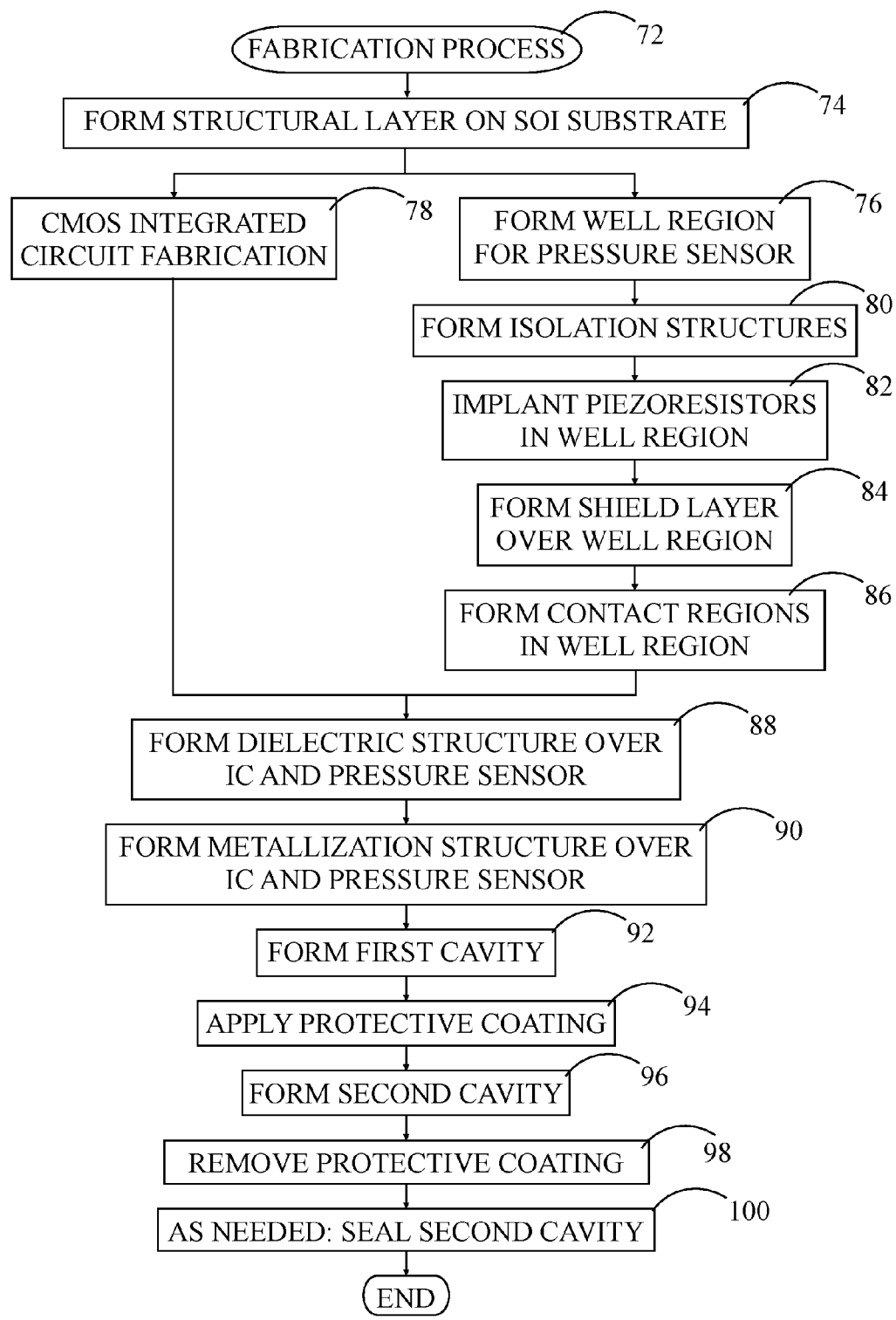
FIG. 2 shows a flowchart of a fabrication process for forming the device of FIG. 1 using CMOS fabrication methodology.

Referring to FIGS. 1 and 2, FIG. 2 shows a flowchart of a fabrication process 72 for forming pressure sensor system 20 using CMOS fabrication methodology. That is, fabrication process 72 entails concurrent fabrication of IC 22 and pressure sensor 24 on a starting material of SOI substrate 26. Fabrication process 72 is described in connection with the fabrication of a single pressure sensor system 20 for simplicity of illustration. However, it should be apparent to those skilled in the art that the ensuing methodology may be executed to concurrently fabricate a plurality of pressure sensor systems 20 in a wafer level fabrication process.

At a block 74 of fabrication process 72, structural layer 48 is formed on first silicon layer 42 of SOI substrate 26. At a block 76 continuing from block 74, well region 54 for pressure sensor 24 is formed in structure layer 48. A block 78 also continues from block 74. At block 78, CMOS integrated circuit 22 is fabricated. Fabrication details of IC 22 are not provided herein for brevity. Rather, block 76 and block 78 continue from block 74 to emphasize that the fabrication of IC 22 occurs concurrent with the fabrication of pressure sensor 24 using CMOS fabrication techniques.

At a block 80 following formation of well region 54 at block 76, isolation structures 52 are formed to suitably electrically isolate the various structures of pressure sensor system 20 from one another. At a block 82, piezoresistors 56 are implanted or otherwise formed in well region 54. At a block 84, shield layer 70 is formed over well region 54, and at a block 86, contact regions 58 are formed in well region 54.

As shown, following block 78 representing the fabrication operations associated with IC 22 and following blocks 76, 80, 82, 84, 86 representing the fabrication operations associated with pressure sensor 24, fabrication process 72 merges at a block 88. At block 88, dielectric structure 28 is formed over IC 22 and pressure sensor 24, and at a block 90, metallization structure 30 is formed over dielectric structure 28. Thereafter, at a block 92, first cavity 60 is formed extending through metallization structure 30 and dielectric structure 28 stopping at shield layer 70.

At a block 94, a protective coating (if needed) may be applied in first cavity 60, over exterior surface 38, and over exterior structures 40. At a block 96 following block 94, second cavity 62 is formed extending through dielectric material layer 64 and second silicon layer 44 stopping at insulator layer 46, thus forming diaphragm 68 of pressure sensor 24. Again, as mentioned above, second cavity 62 may further extend through insulator layer 46 to stop at first silicon layer 42 in alternative configurations. At a block 98, the protective coating is removed following formation of second cavity 62.

Pressure sensor system 20 includes pressure sensor 24 configured to measure a differential pressure. Hence, both sides of diaphragm 68 are exposed to external environments via first and second cavities 60, 62. In some instances, design requirements may call for an absolute pressure sensor configuration in lieu of the differential pressure sensor configuration of FIG. 1. Under such a scenario, fabrication process 72 continues with a block 100. At block 100, second cavity 62 is suitably sealed. Such a configuration will be discussed in connection with FIG. 19. Accordingly following block 98 or block 100, fabrication process 72 ends.

Figure 3:
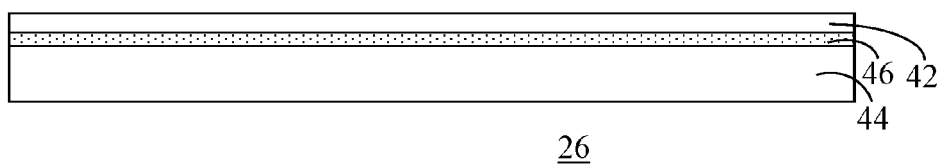
FIG. 3 shows a side view of a starting material used to fabricate the device of FIG. 1.

FIG. 3 shows a side view of a starting material used to fabricate pressure sensor system 20. More particularly, FIG. 3 shows SOI substrate 26 having first and second silicon layers 42, 44 with insulator layer 46 interposed between first and second silicon layers 42, 44 as the starting material for pressure sensor system 20 (FIG. 1). In an example embodiment, first silicon layer 42 may be a P-type silicon wafer over insulator layer 46, which is sometimes referred to as a buried oxide (i.e., BOX) layer. Second silicon layer 44 may be an N-type handle wafer.

Figure 4:
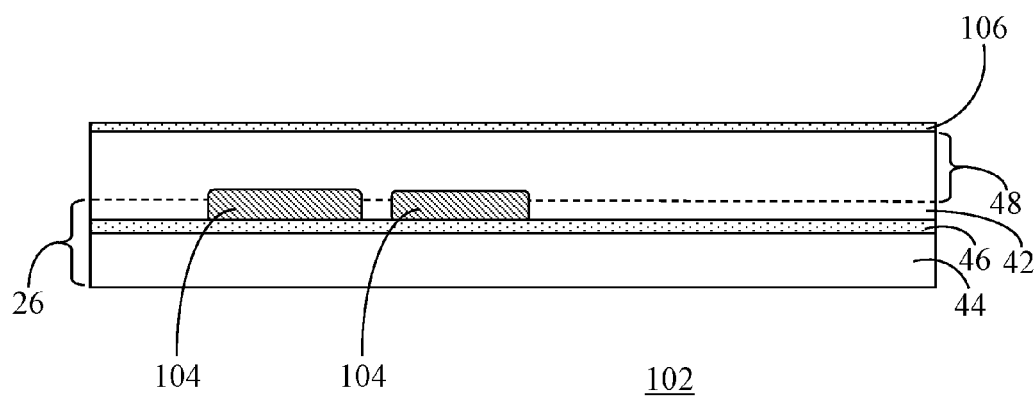
FIG. 4 shows a side view of a structure at an initial stage of processing in accordance with the fabrication process of FIG. 2.

FIG. 4 shows a side view of a structure at an initial stage 102 of processing in accordance with fabrication process 72 (FIG. 2). In accordance with block 74 of fabrication process 72 (FIG. 2), structural layer 48 is formed on SOI substrate 26. In accordance with CMOS fabrication methodology, N-type buried layers 104 for transistors 50 (FIG. 1) may be formed by, for example, ion implantation into first silicon layer 42. Thereafter, structural layer 48 may be formed. By way of example, structural layer 48 may be formed by a P-type epitaxial layer deposition process followed by an oxide growth process that leaves an oxide layer 106 over structural layer 48

Figure 5:
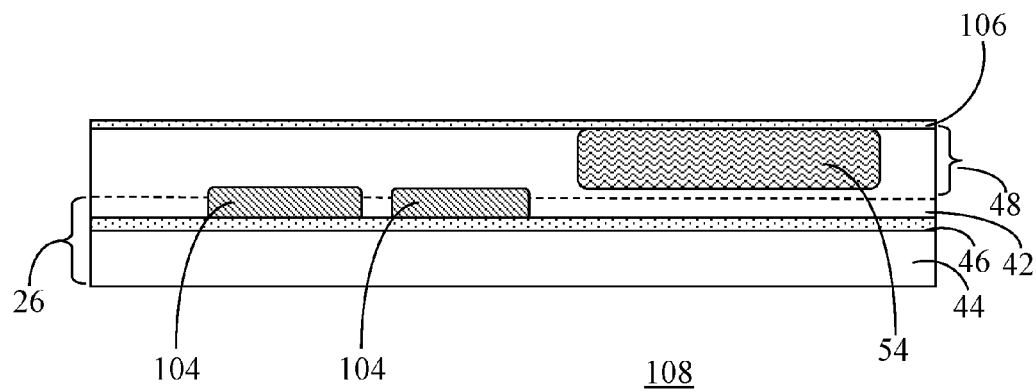
FIG. 5 shows a side view of the structure of FIG. 4 at a subsequent stage of processing.

FIG. 5 shows a side view of the structure of FIG. 4 at a subsequent stage 108 of processing. In accordance with block 76 of fabrication process 72, well region 54 for pressure sensor 24 (FIG. 1) is formed in structural layer 48. Well region 54 may be formed by, for example, a photolithography and N-well implantation process to produce well region 54 in the P-type epitaxial structural layer 48

Figure 6:
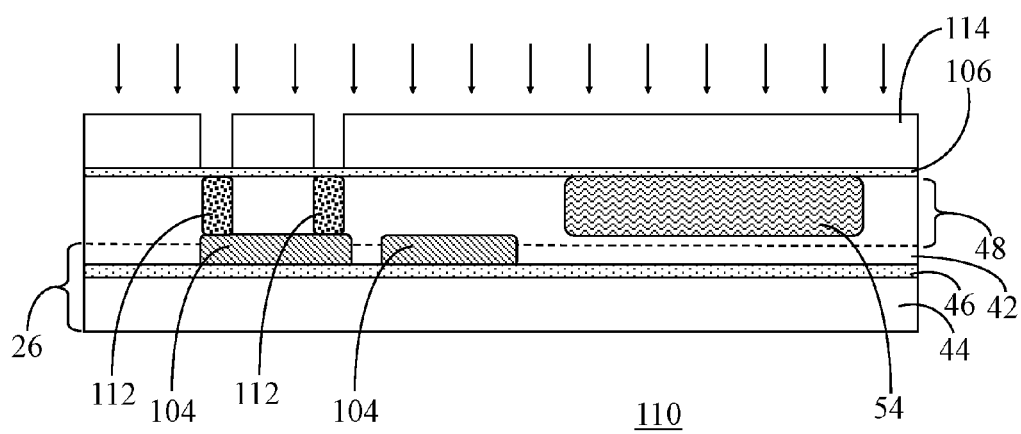
FIG. 6 shows a side view of the structure of FIG. 5 at a subsequent stage of processing.

FIG. 6 shows a side view of the structure of FIG. 5 at a subsequent stage 110 of processing. In accordance with block 78 (FIG. 2) of fabrication process 72, deep N+ type regions 112 may be implanted in P-type epitaxial structural layer 48 to make electrical contact with N-type buried layers 104. Accordingly, a photoresist 114 may be applied across the structure with openings in the photoresist 114 at which deep N+ type regions 112 are to be formed. Thereafter, an implantation process yields deep N+ type regions 112.

Figure 7:
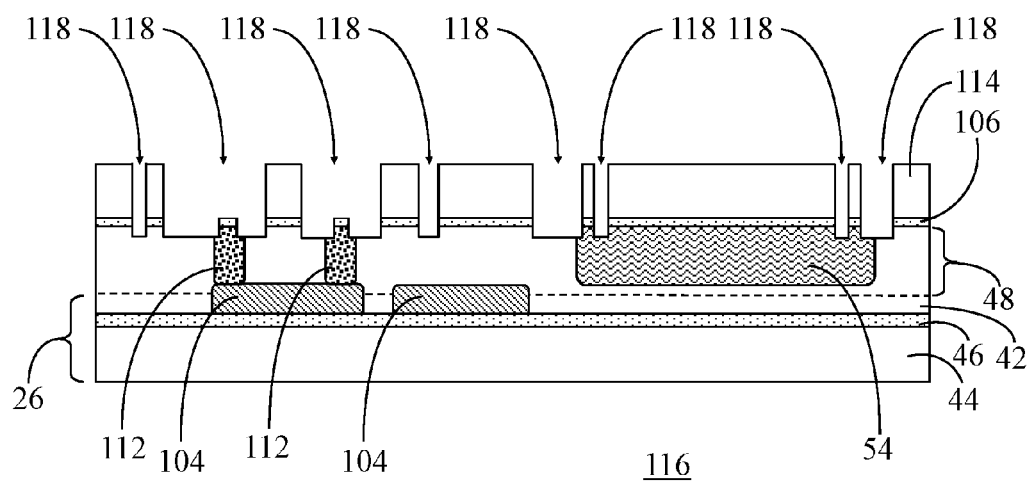
FIG. 7 shows a side view of the structure of FIG. 6 at a subsequent stage of processing.

FIG. 7 shows a side view of the structure of FIG. 6 at a subsequent stage 116 of processing. In accordance with block 78 (FIG. 2) of fabrication process 72, active area definition is performed. In active area definition, those regions at which other structures of IC 22 and pressure sensor 24 may be formed are defined and shallow trenches 118 are formed. By way of example, shallow trenches 118 may be etched through photoresist 114, oxide layer 106 and into structural layer 48, well region 54, and N+ type regions 112.

Figure 8:
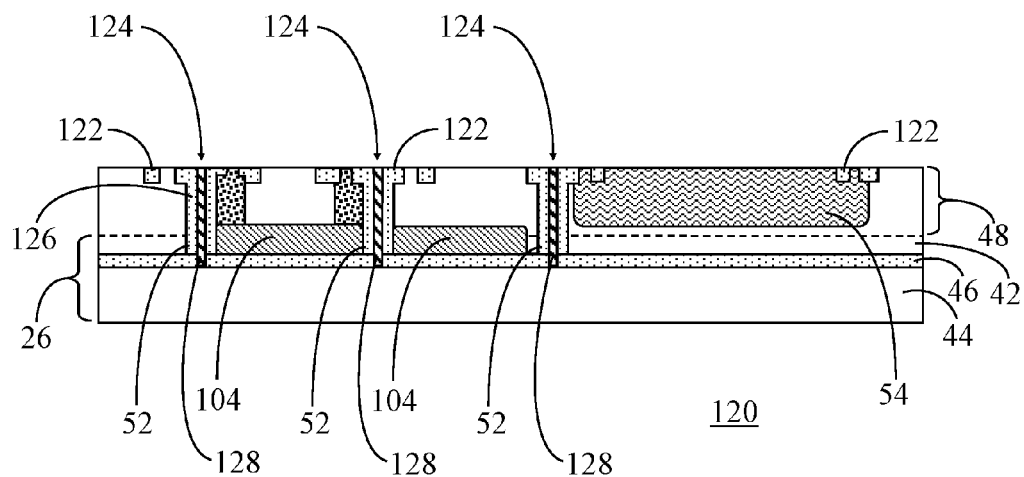
FIG. 8 shows a side view of the structure of FIG. 7 at a subsequent stage of processing.

FIG. 8 shows a side view of the structure of FIG. 7 at a subsequent stage 120 of processing. In accordance with blocks 78 and 80 (FIG. 2) of fabrication process 72, isolation structures 52 are formed. In an example process, photoresist 114 and oxide 106 (FIG. 7) have been stripped. Thereafter, various processes may be performed to fill shallow trenches 118 (FIG. 7) with a sacrificial oxide 122, to hard mask shallow trenches 118 by nitride deposition followed by Tetraethyl Orthosilicate (TEOS) deposition, and to form deep trenches 124 through structural layer 48 and through insulator layer 46. Deep trenches 124 can be lined with an oxide material 126 and the lined deep trenches 124 may then be filled with, for example, polysilicon 128 to produce isolation structures 52. It should be understood that various alternative processes may be performed to produce isolation structures 52.

Figure 9:
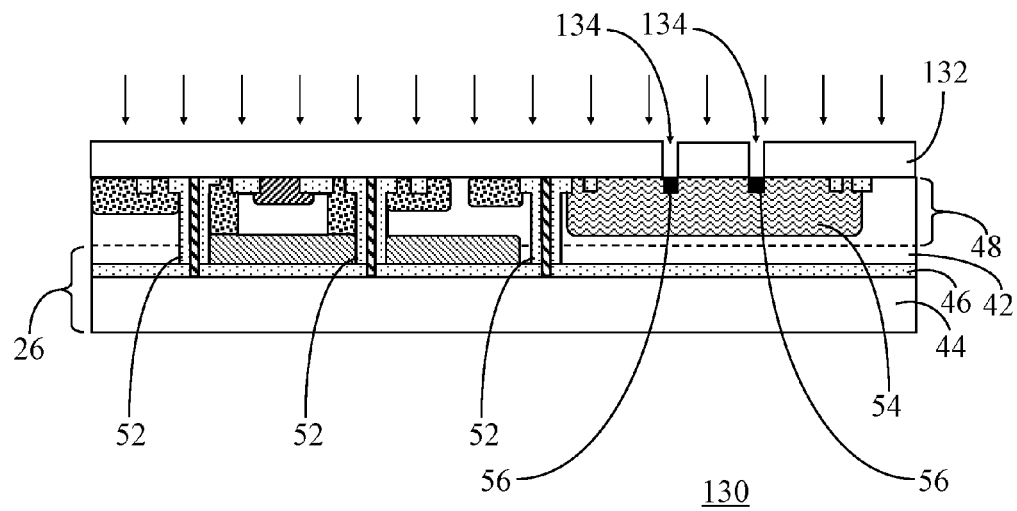
FIG. 9 shows a side view of the structure of FIG. 8 at a subsequent stage of processing.

FIG. 9 shows a side view of the structure of FIG. 8 at a subsequent stage 130 of processing. In accordance with block 82 (FIG. 2) of fabrication process 72, piezoresistors 56 are implanted in well region 54 for pressure sensor 24. Accordingly, a photoresist 132 may be applied across the structure with openings 134 in the photoresist 132 at which piezoresistors 56 are to be formed. Thereafter, an implantation process yields piezoresistors 56 in well region 54. It should be observed in FIG. 9, that other structures of IC 22 (FIG. 1) have been formed in the interim and concurrently with the formation of the structures of pressure sensor 24 in accordance with block 78 (FIG. 2) of fabrication process 72. The details of these additional structures are not described herein for brevity.

Figure 10:
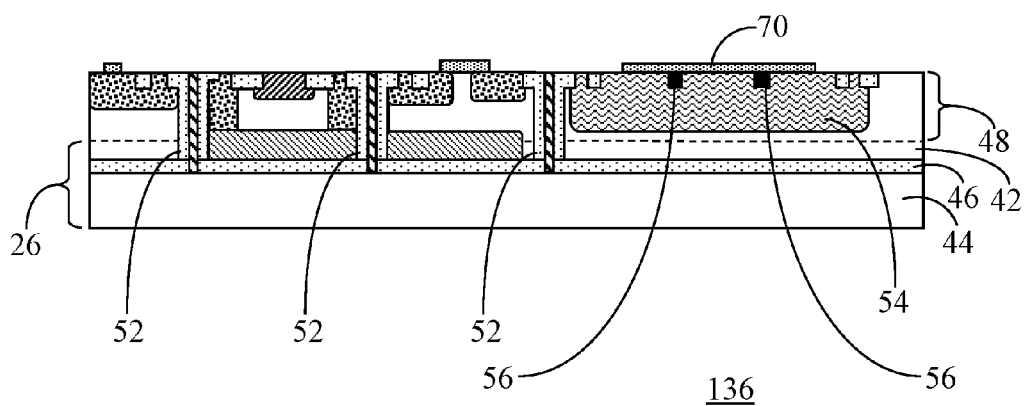
FIG. 10 shows a side view of the structure of FIG. 9 at a subsequent stage of processing.

FIG. 10 shows a side view of the structure of FIG. 9 at a subsequent stage 136 of processing. In accordance with block 84 (FIG. 2) of fabrication process 72, shield layer 70 is formed over well region 54 for pressure sensor 22. It should be observed in FIG. 10, that other structures of IC 22 (FIG. 1) have been formed in the interim and concurrently with the formation of shield layer 70 for pressure sensor 24 in accordance with block 78 of fabrication process 72. The details of these additional structures are not described herein for brevity.

Figure 11:
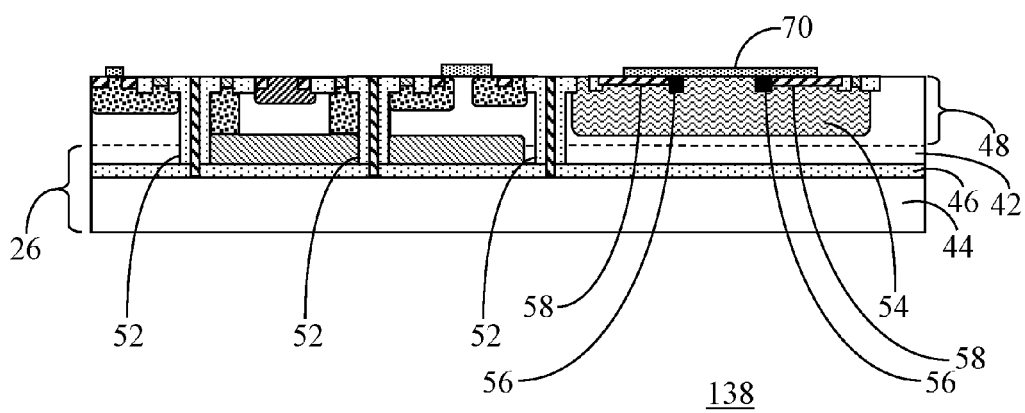
FIG. 11 shows a side view of the structure of FIG. 10 at a subsequent stage of processing.

FIG. 11 shows a side view of the structure of FIG. 10 at a subsequent stage 138 of processing. In accordance with block 86 (FIG. 2) of fabrication process 72, contact regions 58 are formed in well region 54 for pressure sensor 24 by, for example, photo PSD implant. Contact regions 58 (e.g., P+ type) will be used to electrically interconnect piezoresistors 56 to their respective electrical contacts 36 (FIG. 1) extending through metallization structure 30 (FIG. 1). It should be observed in FIG. 11, that other structures (e.g., P+ type contact regions) of IC 22 (FIG. 1) have been formed in the interim and concurrently with the formation of contact regions 58 for pressure sensor 24 in accordance with block 78 of fabrication process 72. The details of these additional structures are not described herein for brevity.

Figure 12:
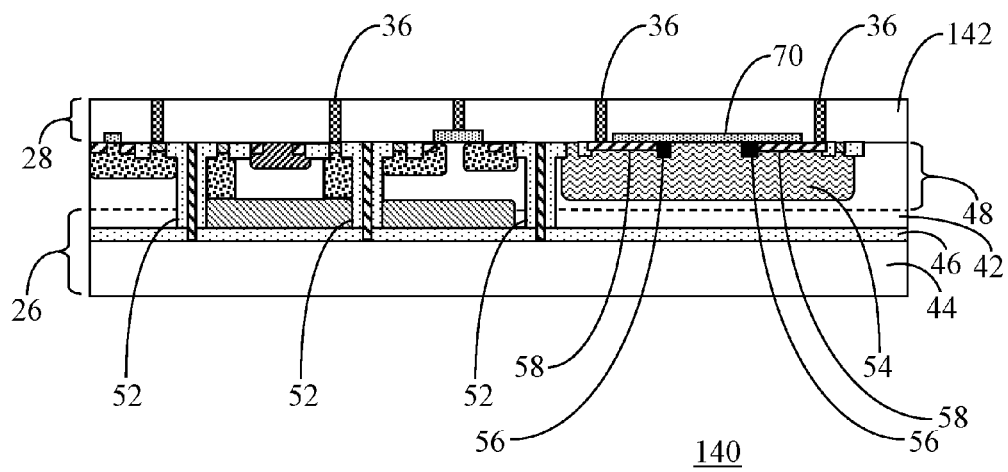
FIG. 12 shows a side view of the structure of FIG. 11 at a subsequent stage of processing.

FIG. 12 shows a side view of the structure of FIG. 11 at a subsequent stage 140 of processing. In accordance with block 88 (FIG. 2) of fabrication process 72, dielectric structure 28 is formed over IC 22 and pressure sensor 24. A dielectric material 142 is deposited over IC 22 and pressure sensor 24. Electrical contacts 36 in the form of, for example, Tungsten or any other suitable material may be formed in dielectric material 142 per conventional CMOS processes. Electrical contacts 36 are electrically connected to contact regions 58 for pressure sensor 24 and other electrical contacts 36 may be suitably electrically connected to contact regions for IC 22.

Figure 13:
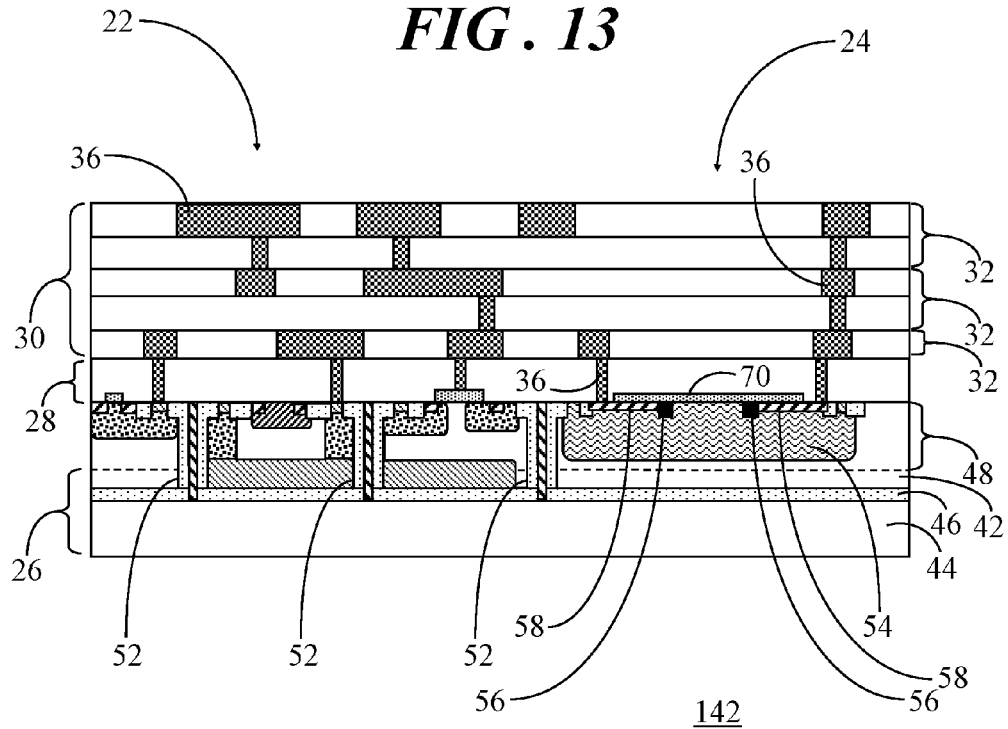
FIG. 13 shows a side view of the structure of FIG. 12 at a subsequent stage of processing.

FIG. 13 shows a side view of the structure of FIG. 12 at a subsequent stage 142 of processing. In accordance with block 90 (FIG. 2) of fabrication process 72, metallization structure 30 is formed over IC 22 and pressure sensor 24. Metallization structure 30 can include multiple metallization layers 32. The various metallization layers 32 are formed from, for example, a TEOS insulator. Electrical contacts 36, which may be copper or any other suitable metal, are formed extending through the TEOS insulator of metallization layers 32. Thus, the formation of dielectric structure 28 and metallization layers 32 with electrical contacts 36 extending through them enable the provision of power and control signals to, as well as data output from, IC 22 and pressure sensor 24 in accordance with a particular design configuration.

Figure 14:
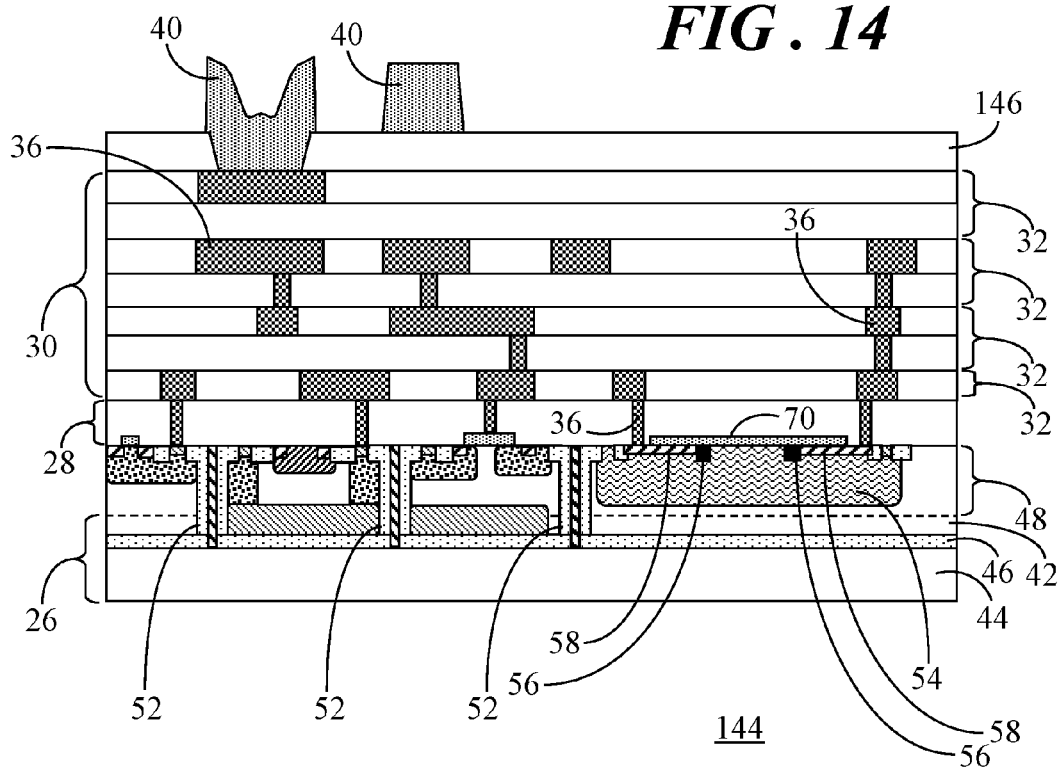
FIG. 14 shows a side view of the structure of FIG. 13 at a subsequent stage of processing.

FIG. 14 shows a side view of the structure of FIG. 13 at a subsequent stage 144 of processing. Subsequent conventional CMOS processing operations may entail the formation of another metallization layer 32, followed by passivation layer 146, and formation of external structures 40.

Figure 15:
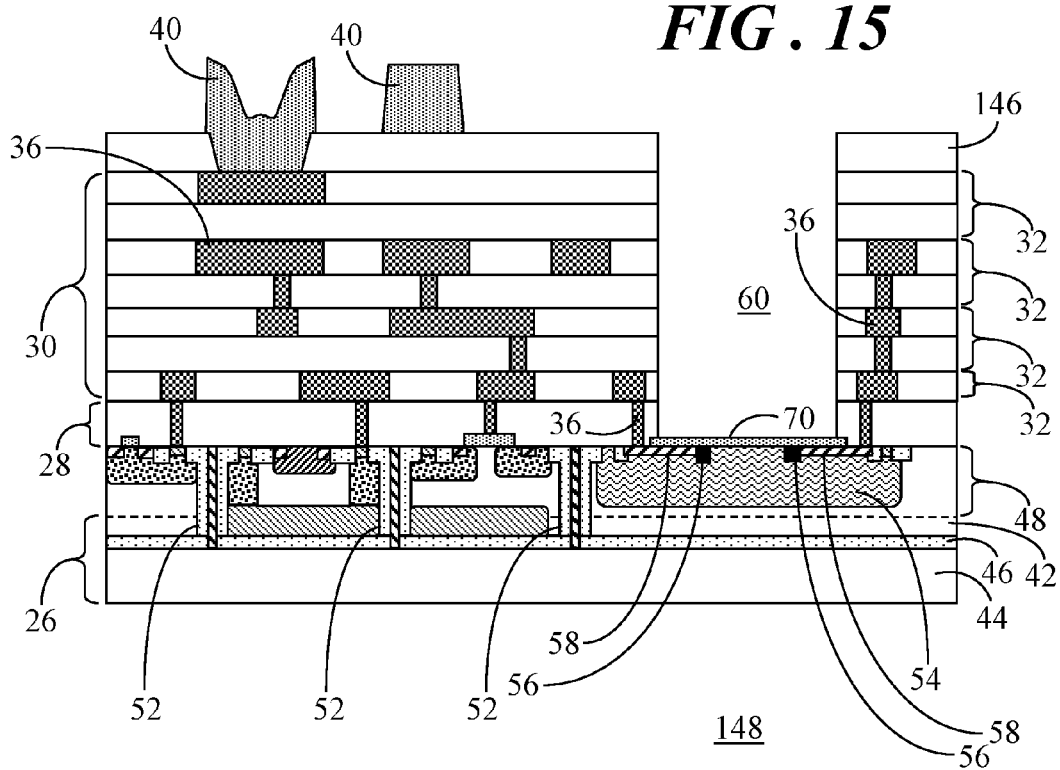
FIG. 15 shows a side view of the structure of FIG. 14 at a subsequent stage of processing.

Referring now to FIG. 15, FIG. 15 shows a side view of the structure of FIG. 14 at a subsequent stage 148 of processing. In accordance with block 92 (FIG. 2) of fabrication process 72, first cavity 60 is formed extending through passivation layer 146, metallization structure 30, and dielectric structure 28 overlying well region 54 of pressure sensor 24. It should be observed that shield layer 70 for pressure sensor 24 is not removed during the formation of first cavity 60.

Figure 16:
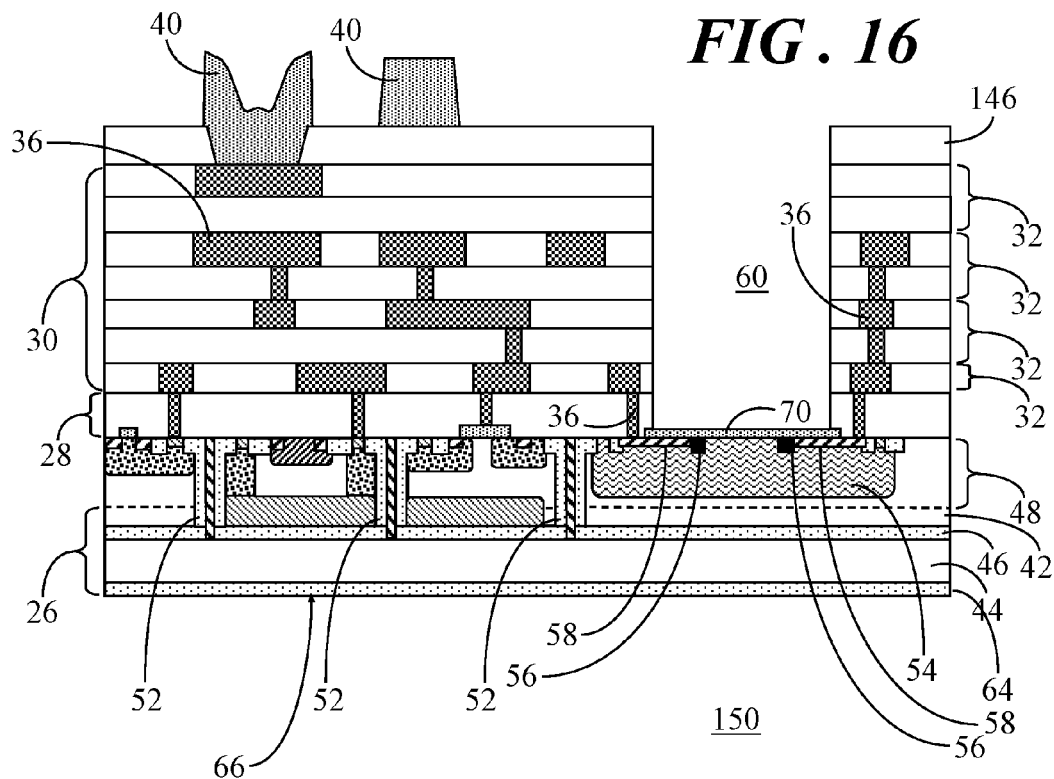
FIG. 16 shows a side view of the structure of FIG. 15 at a subsequent stage of processing.

FIG. 16 shows a side view of the structure of FIG. 15 at a subsequent stage 150 of processing. As shown in FIG. 16, continued CMOS processing may entail backside grind and polish of second silicon layer 44, followed by deposition of dielectric material layer 64 (e.g., TEOS) on exterior surface 66 of second silicon layer 44.

Figure 17:
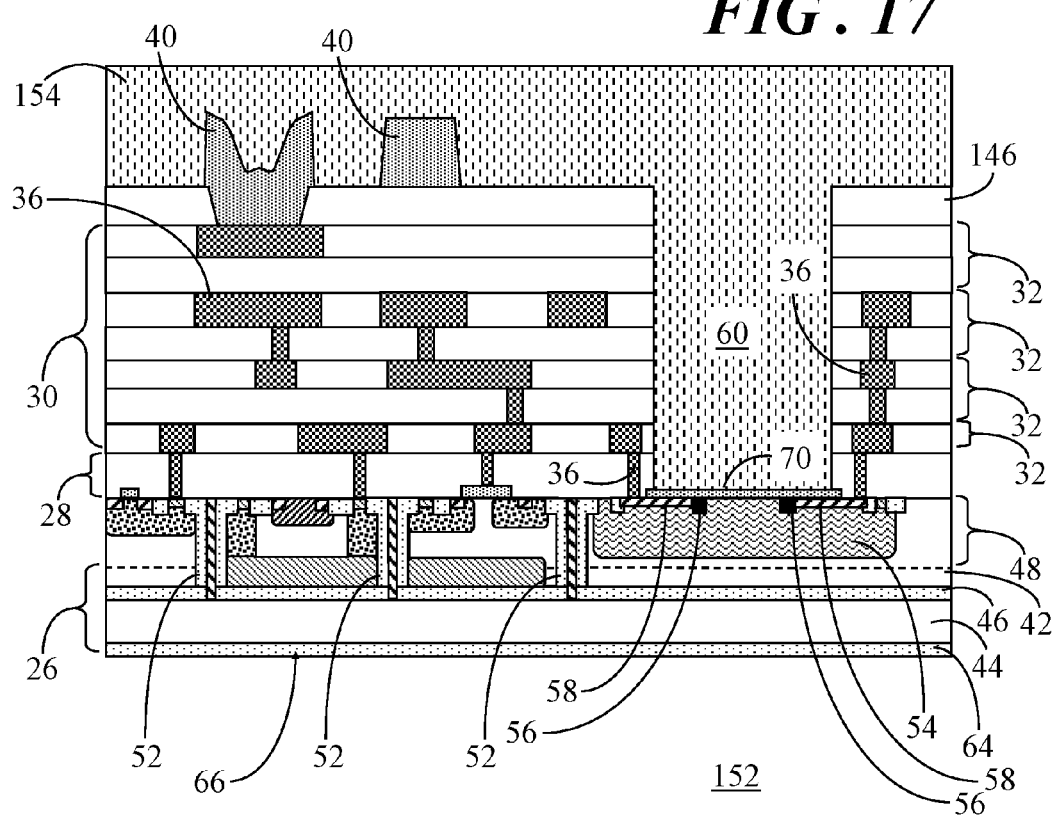
FIG. 17 shows a side view of the structure of FIG. 16 at a subsequent stage of processing.

FIG. 17 shows a side view of the structure of FIG. 16 at a subsequent stage 152 of processing. In accordance with block 94 (FIG. 2) of fabrication process 72, a protective coating 154 may be applied in first cavity 60 and over exterior surface 38 of pressure sensor system 20. In some embodiments, protective coating 154 may be used to provide front side protection of pressure sensor system 20 during the formation of second cavity 62 (FIG. 1).

Figure 18:
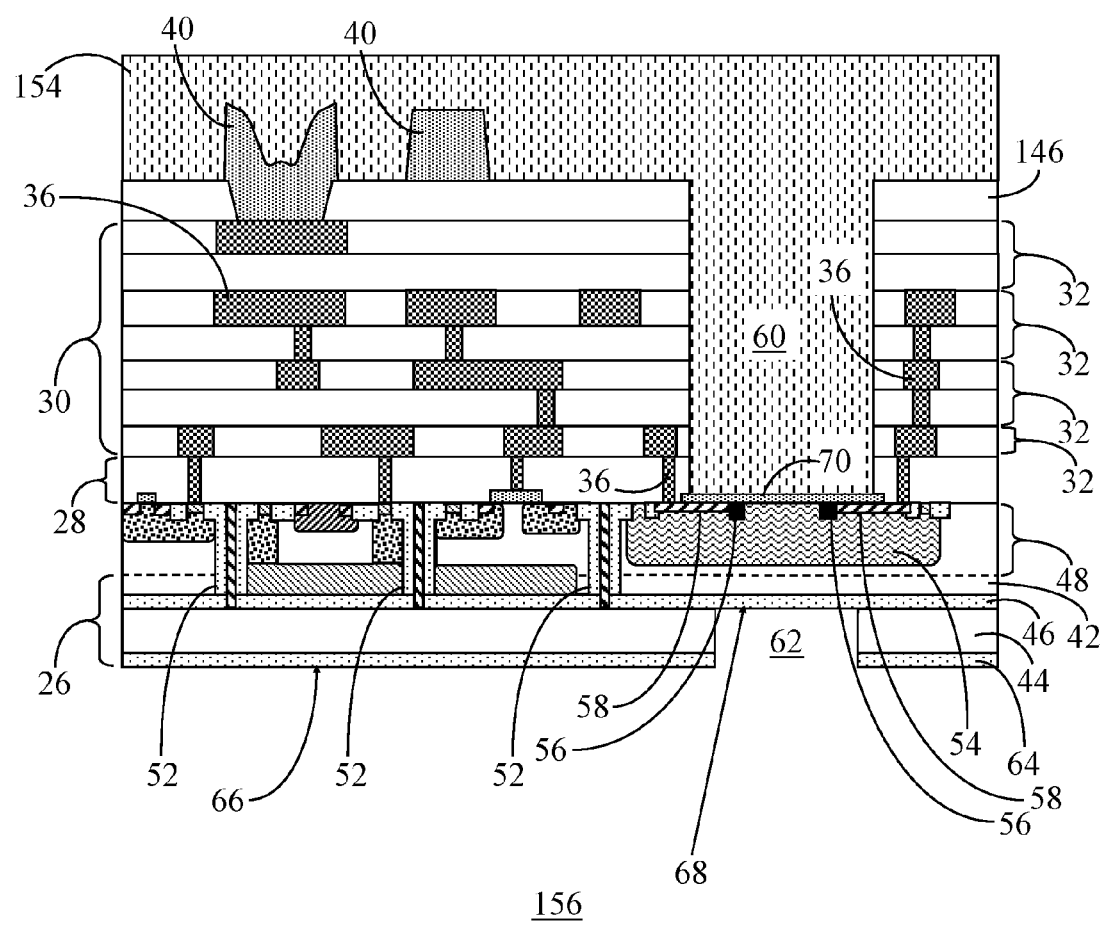
FIG. 18 shows a side view of the structure of FIG. 17 at a subsequent stage of processing.

FIG. 18 shows a side view of the structure of FIG. 17 at a subsequent stage 156 of processing. In accordance with block 96 (FIG. 2) of fabrication process 72, second cavity 62 is formed extending through dielectric material layer 64 and through second silicon layer 44 to yield diaphragm 68 of pressure sensor 24. Second cavity 62 may be formed using a deep reactive ion etch (DRIE) process. Insulator layer 46 is used as the DRIE etch stop. DRIE is a highly anisotropic etch process typically used to create deep penetration, steep-sided holes and trenches in wafers/substrates, typically with high aspect ratios. It is advantageous over an electrochemical etch (ECE) process in that an ECE process is typically a more complicated process and hence more costly to perform. Following the formation of second cavity 62, protective coating 154 (if used) is removed in accordance with block 98 (FIG. 2) of fabrication process 72.

Figure 19:
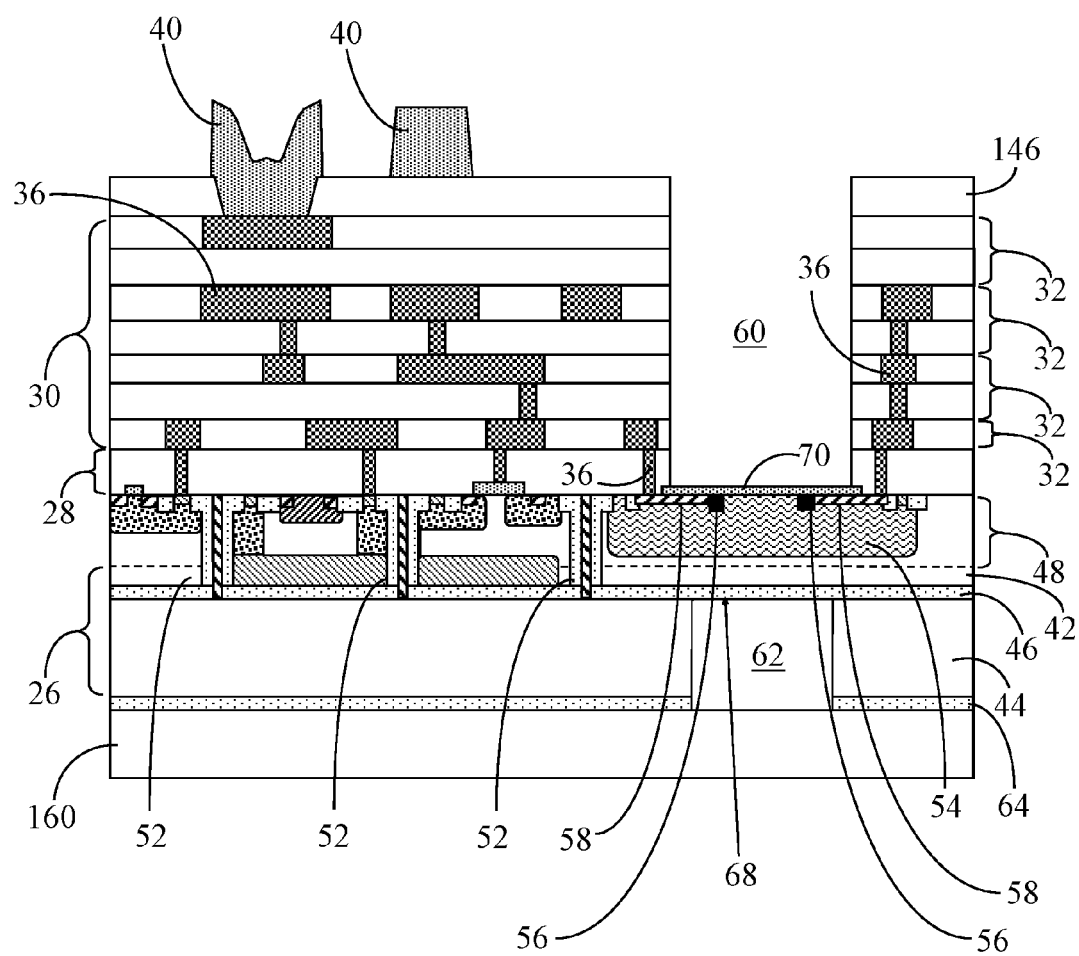
FIG. 19 shows simplified a side view of a device that includes a complementary metal oxide semiconductor (CMOS) integrated circuit (IC) and a pressure sensor integrated on a single substrate in accordance with another embodiment.

FIG. 19 shows simplified a side view of a device 158 that includes CMOS IC 22 and pressure sensor 24 integrated on a single SOI substrate 26 in accordance with another embodiment. Thus, device 158 will be referred to hereinafter as pressure sensor system 158. It will be recalled that pressure sensor system 20 (FIG. 1) is configured to measure a differential pressure. Hence both sides of diaphragm 68 are exposed to external environments via first and second cavities 60, 62. Pressure sensor system 158 is configured as an absolute pressure sensor in lieu of the differential pressure sensor configuration of FIG. 1. Thus, in accordance with block 100 (FIG. 2) of fabrication process 72, second cavity 62 is sealed.

In an embodiment, a second substrate 160 may be coupled to an outer surface of second silicon layer 44, and more particularly, to dielectric material layer 64 deposited on exterior surface 66 of second silicon layer 44 to seal second cavity 62. As such, pressure sensor system 158 can be configured as an absolute pressure sensor system in which the pressure in second cavity 62 is constant, for example, at or near vacuum.

Thus, a pressure sensor, a pressure sensor system that includes a pressure sensor integrated with a complementary metal oxide semiconductor (CMOS) integrated circuit on a single substrate, and methodology for concurrently fabricating the pressure sensor and the CMOS integrated circuit using a CMOS fabrication process are disclosed herein. An embodiment of a device comprises a silicon-on-insulator (SOI) substrate, the SOI substrate having a first silicon layer, a second silicon layer, and an insulator layer interposed between the first and second silicon layers. The device further comprises a structural layer formed on the first silicon layer of the SOI substrate, the structural layer having a first conductivity type, a well region formed in the structural layer, the well region having a second conductivity type that is opposite from the first conductivity type, and at least one resistor in the well region. The device further comprises a metallization structure formed over the well region and the at least one resistor, a first cavity extending through the metallization structure overlying the well region, and a second cavity extending through the second silicon layer of the SOI substrate, the second cavity stopping at one of the first silicon layer and the insulator layer, wherein the well region interposed between the first and second cavities defines a diaphragm of a pressure sensor An embodiment of method of fabricating a pressure sensor comprises forming a structural layer on a first silicon layer of a silicon-on-insulator (SOI) substrate, the SOI substrate having the first silicon layer, a second silicon layer, and an insulator layer interposed between the first and second silicon layers, and the structural layer having a first conductivity type. The method further comprises forming a well region in the structural layer, the well region having a second conductivity type that is opposite from the first conductivity type, forming at least one resistor in the well region, forming a first cavity extending through the metallization structure overlying the well region, and forming a second cavity extending through the second silicon layer of the SOI substrate, the second cavity stopping at one of the first silicon layer and the insulator layer, wherein the well region interposed between the first and second cavities defines a diaphragm of the pressure sensor.

Another embodiment of a device comprises a silicon-on-insulator (SOI) substrate, the SOI substrate having a first silicon layer, a second silicon layer, and an insulator layer interposed between the first and second silicon layers, and a structural layer formed on the first silicon layer of the SOI substrate, the structural layer having a first conductivity type. The device further comprises a pressure sensor having a well region and at least one resistor formed in the structural layer, a complementary metal oxide semiconductor (CMOS) integrated circuit on the first silicon layer of the SOI substrate in the structural layer, and metallization structure formed over the well region, the at least one resistor, and the CMOS integrated circuit. A first cavity extends through the metallization structure overlying the well region and a second cavity extends through the second silicon layer of the SOI substrate, the second cavity stopping at one of the first silicon layer and the insulator layer, wherein the well region interposed between the first and second cavities defines a diaphragm of the pressure sensor.

The various inventive concepts and principles embodied herein enable the fabrication of an integrated pressure sensor and the CMOS integrated circuit to improve fabrication efficiency, simplify system packaging, minimize device footprint, improve device performance, and achieve cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device comprising:
   a silicon-on-insulator (SOI) substrate, said SOI substrate having a first silicon layer, a second silicon layer, and an insulator layer interposed between said first and second silicon layers;
   a structural layer formed on said first silicon layer of said SOI substrate, said structural layer having a first conductivity type;
   a well region formed in said structural layer, said well region having a second conductivity type that is opposite from said first conductivity type;
   at least one resistor in said well region;
   a metallization structure formed over said well region and said at least one resistor;
   a first cavity extending through said metallization structure overlying said well region; and
   a second cavity extending through said second silicon layer of said SOI substrate, said second cavity stopping at one of said first silicon layer and said insulator layer, wherein said well region interposed between said first and second cavities defines a diaphragm of a pressure sensor.

2. The device of claim 1 further comprising a shield layer formed over said well region.

3. The device of claim 1 further comprising electrical contacts in said metallization structure, said electrical contacts being electrically connected to said at least one resistor in said well region, and said electrical contacts being laterally displaced away from said first cavity.

4. The device of claim 1 wherein said metallization structure includes multiple metallization layers, and said first cavity extends through all of said metallization layers.

5. The device of claim 1 further comprising a second substrate coupled to an outer surface of said second silicon layer, said second substrate sealing said second cavity from an environment external to said device.

6. The device of claim 1 further comprising a complementary metal oxide semiconductor (CMOS) integrated circuit on said first silicon layer of said SOI substrate, said CMOS integrated circuit being electrically isolated from said pressure sensor.

7. A method of fabricating a pressure sensor comprising:
   forming a structural layer on a first silicon layer of a silicon-on-insulator (SOI) substrate, said SOI substrate having said first silicon layer, a second silicon layer, and an insulator layer interposed between said first and second silicon layers, and said structural layer having a first conductivity type;
   forming a well region in said structural layer, said well region having a second conductivity type that is opposite from said first conductivity type;
   forming at least one resistor in said well region;
   forming a first cavity extending through said metallization structure overlying said well region; and
   forming a second cavity extending through said second silicon layer of said SOI substrate, said second cavity stopping at one of said first silicon layer and said insulator layer, wherein said well region interposed between said first and second cavities defines a diaphragm of said pressure sensor.

8. The method of claim 7 wherein said metallization structure includes multiple metallization layers, and said first cavity extends through all of said metallization layers.

9. The method of claim 7 wherein said forming said second cavity comprises performing a deep reactive ion etch (DRIE) process to form said second cavity.

10. The method of claim 7 further comprising:
applying a protection coating in said first cavity and over an exterior surface of said metallization structure prior to said forming said second cavity; and
removing said protection coating following formation of said second cavity.

11. The method of claim 7 further comprising sealing said second cavity from an external environment.

12. The method of claim 11 wherein said sealing comprises coupling a second substrate to an outer surface of said second silicon layer following formation of said second cavity.

13. The method of claim 7 further comprising forming a complementary metal oxide semiconductor (CMOS) integrated circuit on said first silicon layer of said SOI substrate.

14. The method of claim 13 wherein said forming said CMOS integrated circuit on said first silicon layer is performed concurrent with said forming said well region and said forming said at least one resistor.

15. The method of claim 13 further comprising forming an isolation structure between said pressure sensor and said CMOS integrated circuit, said isolation structure electrically isolating said CMOS integrated circuit from said pressure sensor.

16. A device comprising:
a silicon-on-insulator (SOI) substrate, said SOI substrate having a first silicon layer, a second silicon layer, and an insulator layer interposed between said first and second silicon layers;
a structural layer formed on said first silicon layer of said SOI substrate, said structural layer having a first conductivity type;
a pressure sensor having a well region and at least one resistor formed in said structural layer;
a complementary metal oxide semiconductor (CMOS) integrated circuit on said first silicon layer of said SOI substrate in said structural layer; and
metallization structure formed over said well region, said at least one resistor, and said CMOS integrated circuit, wherein a first cavity extends through said metallization structure overlying said well region and a second cavity extends through said second silicon layer of said SOI substrate, said second cavity stopping at one of said first silicon layer and said insulator layer, and wherein said well region interposed between said first and second cavities defines a diaphragm of said pressure sensor.

17. The device of claim 16 further comprising an isolation structure between said diaphragm of said pressure sensor and said CMOS integrated circuit, said isolation structure electrically isolating said CMOS integrated circuit from said pressure sensor.

18. The device of claim 16 wherein said metallization structure includes electrical contacts, said electrical contacts being connected to said at least one resistor, and said electrical contacts being laterally displaced away from said first cavity.

19. The device of claim 16 wherein said metallization structure includes multiple metallization layers, and said first cavity extends through all of said metallization layers.

20. The device of claim 16 further comprising a second substrate coupled to an outer surface of said second silicon layer, said second substrate sealing said second cavity from an environment external to said device.

* * * * *